(12) United States Patent
Jacobs et al.

(10) Patent No.: US 7,667,822 B2
(45) Date of Patent: Feb. 23, 2010

(54) LITHOGRAPHIC APPARATUS AND STAGE APPARATUS

(75) Inventors: Fransicus Mathijs Jacobs, Asten (NL); Erik Roelof Loopstra, Heeze (NL); Harmen Klaas Van der Schoot, Vught (NL); Arjan Franklin Bakker, Helenaveen (NL); Arjan Martin Van der Wel, Eindhoven (NL); Krijn Frederik Bustraan, Eindhoven (NL); Marcel Koenraad Marie Baggen, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 272 days.

(21) Appl. No.: 11/353,249

(22) Filed: Feb. 14, 2006

(65) Prior Publication Data

US 2007/0188724 A1  Aug. 16, 2007

(51) Int. Cl.
*G03B 27/62* (2006.01)
(52) U.S. Cl. ............................... 355/75; 355/72; 355/53
(58) Field of Classification Search .................... 355/53, 355/72, 75
See application file for complete search history.

(56) References Cited

U.S. PATENT DOCUMENTS

| | | | |
|---|---|---|---|
| 6,327,026 B1 * | 12/2001 | Wakui | 355/72 |
| 6,469,773 B1 * | 10/2002 | Iwamoto | 355/53 |
| 2004/0165172 A1 * | 8/2004 | Poon et al. | 355/72 |
| 2005/0030498 A1 * | 2/2005 | Mulkens | 355/30 |
| 2005/0105069 A1 * | 5/2005 | Loopstra et al. | 355/53 |
| 2005/0117142 A1 * | 6/2005 | Heerens et al. | 355/75 |

\* cited by examiner

*Primary Examiner*—Edward J Glick
*Assistant Examiner*—Steven H Whitesell-Gordon
(74) *Attorney, Agent, or Firm*—Pillsbury Winthrop Shaw Pittman LLP

(57) ABSTRACT

A lithographic apparatus includes a support constructed to support a patterning device. The patterning device is capable of imparting a radiation beam with a pattern in its cross-section to form a patterned radiation beam. The support includes a force actuator device to exert a force onto the patterning device in a direction of movement of the support. The force actuator device includes a movable part which is pivotably about a pivot axis and thereby connected to the support. The movable part is in the direction of movement of the support substantially balanced with respect to the pivot axis. The force actuator device further includes an actuator to exert via the movable part the force onto the patterning device, to at least partly compensate for the information or a risk of slippage due to acceleration of the support in the direction of movement.

20 Claims, 7 Drawing Sheets

LITHOGRAPHIC APPARATUS AND STAGE APPARATUS

BACKGROUND

1. Field

The present invention relates to a lithographic apparatus and to a stage apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. Pat. No. 6,469,773 describes a stage apparatus for a lithographic apparatus. The stage apparatus may hold a substrate, which in the context of the document referred to here may includes a reticle or other patterning device. The stage apparatus as described includes a mechanism for generating a force that changes in accordance with an acceleration when the stage moves. The force is applied by the mechanism onto the substrate from the direction of the acceleration. Thereby, it is intended to compensate for a force between the stage and the substrate which is caused by the acceleration. The mechanism includes a lever which is pivotable about a pivot axis. One end of the lever to establish a contact with a side of the reticle, the other end of the lever being connected to a counter weight. When the stage is accelerated, the counter weight will, due to inertia, exert a force onto the lever which translates into a force by the lever onto the side of the reticle. As inertia effects are proportional to the acceleration of the stage, the force which is applied by the lever onto the substrate is also proportional to the acceleration.

The mechanism as described in U.S. Pat. No. 6,469,773 is intended to enable the stage to be subjected to high accelerations. This is because the higher the acceleration, the higher the forces that the substrate (such as a reticle) which is held by the stage, is subjected too. The substrate may be held by the stage making use of a variety of holding devices, such as a vacuum suction, a mechanic clamp, an electrostatic clamp, etc. In any of these situations, a risk of slippage of the substrate comes into existence at high accelerations, because the holding force with the substrate is held by the holding device may be insufficient to be able to withstand the high forces due to accelerations of the stage. A second aspect is that the high forces during acceleration may result in a (temporary) deformation of the substrate. Such deformation may result in an inaccuracy of the pattern which is to be applied onto the substrate. The mechanism as described in the US Patent as referred to here, is attended to counteract these effects: when the stage is accelerated, the lever will exert a force onto the side of the substrate, thereby intending to provide a force which to some extend compensates for the acceleration forces, thereby attempting to prevent slippage of the substrate (such as a reticle) and deformation thereof.

In the mechanism of U.S. Pat. No. 6,469,773, over-compensation or under-compensation may occur. The force which is to be applied by the lever onto the substrate is substantially proportional to the acceleration of the state and substantially proportional to a weight of the countermass. The force applied onto the substrate to be able to compensate for the acceleration however depends on a mass of the substrate (such as a reticle). Thus, the mechanism as described may only provide compensation for a substrate having a specific mass, for a substrate having a higher mass under-compensation is obtained, while for a substrate having a lower mass, over-compensation is obtained. Due to such under-compensation or over-compensation, again a deformation of the reticle at acceleration may take place. Also, a risk of slippage is again provided for as the force provided by the lever may too small or too large.

Furthermore, the counter masses will increase a total weight of the stage. This is of particular importance as accelerations and velocities of the stage are to be maximized in a lithographic apparatus design, to be able to achieve a fast processing. The additional mass introduced by the mechanism will increase a total weight of the stage, thereby decreasing a maximum acceleration to be achieved thereby. Again, a further problem may be found when applying an acceleration to the stage which is opposite to the direction of acceleration in which the mechanism would push against the reticle. In that case, the mechanism will come loose from the reticle. Now, when a direction of the acceleration changes, a collision of the mechanism against the reticle may occur which may damage the reticle and/or may statically or dynamically displace the reticle with respect to the stage, thereby creating a static or dynamic alignment or deformation error.

The lever of the mechanism described in U.S. Pat. No. 6,469,773 is fully pivotable about the pivot axis, being subjected to acceleration forces. In a state of constant velocity, this may imply that the lever rests against the side of the substrate, however it may also be the case that the lever is to a certain extent free from the substrate, e.g. leaving a gap therebetween. The inventors of the present patent applications have now devised that a source of inaccuracy comes forward therefrom. In case that the lever rests against the reticle, this appears to result in a small residual force onto the side of the substrate which in turn results in a small deformation of the substrate. This is of particular importance in a common lithographic apparatus, where irradiation takes place in the phase of constant velocity of the stage. The remaining force which results in a remaining deformation, thereby introduces an error in applying the pattern by the lithographic apparatus. Furthermore, this error is to a large extent unpredictable as the lever may or may not rest against the side of the substrate during illumination.

SUMMARY

It is desirable to at least reduce errors that are generated when the patterning device support is accelerated.

According to an embodiment of the invention, there is provided a lithographic apparatus including a support constructed to support a patterning device, the patterning device being capable of imparting a radiation beam with a pattern in its cross-section to form a patterned radiation beam, the support including a force actuator device to exert a force onto the patterning device in a direction of movement of the support, the force actuator device including a movable part which is pivotable about a pivot axis connected to the support, the movable part being in the direction of movement of the support substantially balanced with respect to the pivot axis, and an actuator to exert via the movable part the force onto the patterning device.

In another embodiment of the invention, there is provided a stage apparatus for displacing an object having a substantially flat surface, including a support constructed to support the object, the support including a force actuator device to exert a force onto the object in a direction of movement of the support, the force actuator device including a movable part which is pivotable about a pivot axis connected to the support, the movable part being in the direction of movement of the support substantially balanced with respect to the pivot axis, and an actuator to exert via the movable part the force onto the object.

In an embodiment, there is provided a support assembly for a lithographic apparatus, including a support for supporting a patterning device; a moveable part that is pivotable about a pivot axis, the moveable part being substantially balanced with respect to the pivot axis in a direction of movement of the support; and an actuator configured to exert a force onto the patterning device via the moveable part.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
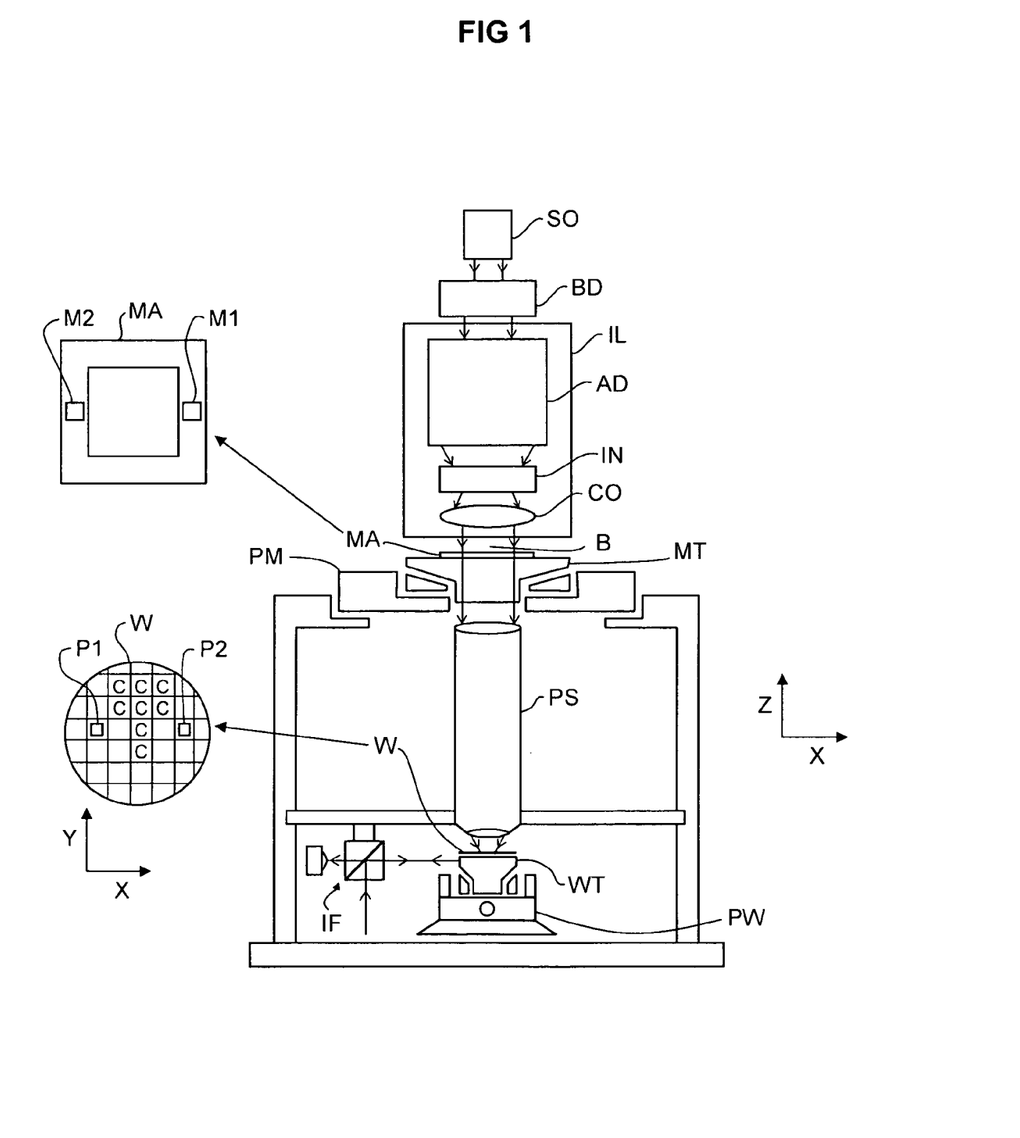
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
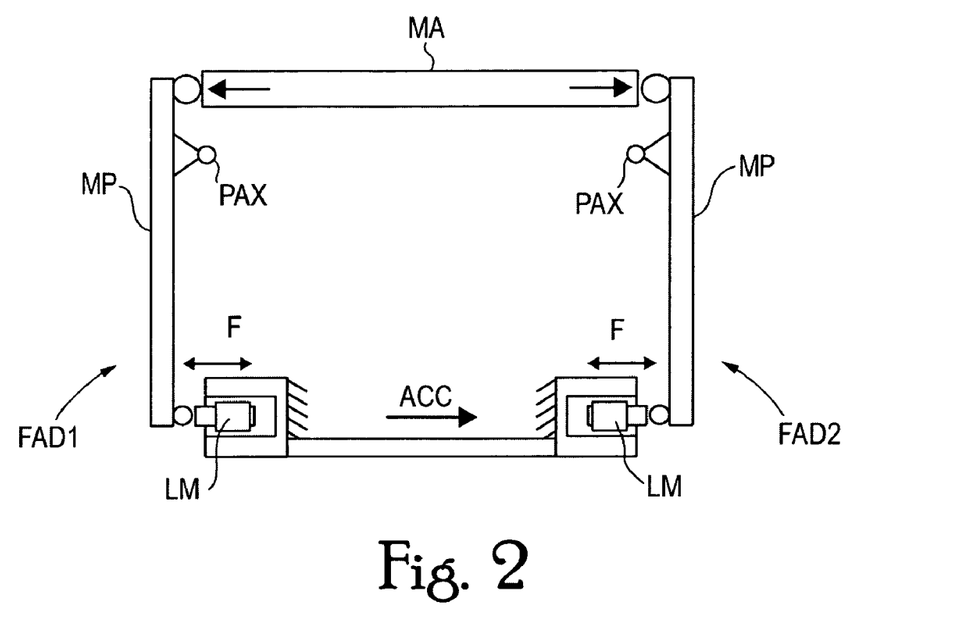
FIG. 2 schematically depicts a patterning device and a force actuator device according to an embodiment of the invention.

FIG. 2 highly schematically depicts a side view of a reticle MA, also indicated as patterning device, and force actuator device to exert a force on the reticle MA. Actually, in FIG. 2 two force actuator devices are shown, the force actuating devices for exerting a force on opposite sides of the reticle MA. Each of the force actuator devices includes a movable part MP which is pivotable about a pivot axis PAX. Further the force actuator device includes an actuator, in this example a linear motor LM, such as a Lorenz motor, to exert a force on the movable part MP. The linear motor LM may via the movable part MP exert a force on the appropriate side of patterning device MA. A direction of acceleration is depicted by the arrow ACC. Naturally, also an acceleration in a reverse direction may take place.

When accelerating in the direction indicated by the arrow ACC, inertia of the reticle MA causes a tendency of the reticle to slip in a direction towards the left in the plane of drawing relative to the support, and/or causes a tendency of reticle MA to bend or deform in a direction towards the left in the plane of drawing. These effects may at least part be counteracted by the force actuator device as schematically depicted here, as the actuator (thus in this example the linear motor LM) may, via the movable part MP, exert a force to the side of the reticle MA to at least partly compensate for the forces that may cause slippage and/or deformation during acceleration. With the force actuator device as schematically depicted here, a plurality of benefits may be obtained: at first high forces may be exerted onto the reticle MA making use of a compact, low weight force actuator device. This may made possible because a length of first arm A1 of the movable part (the first arm extending between the pivot axis PAX and a contact part with which the movable part is to contact the reticle MA) is in this example shorter than a length of a second arm A2 of the movable part (the second arm extending between the pivot axis PAX and a point of application where the actuator force of the actuator LM may be applied onto the second arm A2). Thereby, a force may be exerted onto the patterning device which is larger than the force generated by the linear motor LM, thereby enabling to make use of a compact and light weight linear motor. This is especially beneficial because the movable part MP and the linear motor LM will accelerate with the support which holds the reticle MA, thus a light weight design of the force application device enabling to achieve high accelerations of the support, and thereby enable an exposure by the lithographic apparatus.

Further, the actuator LM may be driven in dependency of the acceleration of the support in the direction of movement. More preferably, the controller is arranged to drive the actuator substantially proportional to the acceleration of the support in the direction of movement. The forces which may attend to cause slippage to the reticle MA or deformation thereof, depend on an acceleration of the support. More precisely, the forces are substantially proportional to the acceleration of the support. Thus, by driving the actuator in dependency on the acceleration, or more preferably substantially proportional to the acceleration, a good compensation of these forces may be achieved.

In FIG. 2, two force actuator devices FAD1, FAD2 are depicted. When an acceleration takes place in the direction indicated by the arrow ACC, the force actuator device FAD1 will be operated to exert a force onto the reticle MA. The other force actuator device FAD2 will under these circumstances be in a rest state. Preferably, the movable part MP of this force actuator device FAD2 is held by the respective linear motor LM such that a small gap occurs between an application point where the movable part is to contact the reticle MA, and the reticle MA itself. Thus, it is prevented that by the second force actuator device FAD2 a force is exerted onto the mask MA2 which may adversely affect a position accuracy of the mask MA with respect with the support, as has been described above. Conversely, when an acceleration takes place in a direction opposite to the direction indicated by the arrow ACC, the functions of the force actuator devices FAD1, FAD2 will be exchanged. In that case the force actuator device FAD2 may exert a force onto the reticle MA, while the force actuator device FAD1 may be positioned as to be free from the reticle MA, thus preferably leaving a small gap between the point of application where the movable part MP is to contact the reticle MA, and the reticle itself. It may also be allowed that the force actuator, being in a rest state, keeps contact with the reticle thereby exerting a very small force on the reticle. This can be beneficial to reduce a risk of contamination of the reticle.

It is noted that in FIG. 2 the support is not specifically depicted. The skilled person will however understand that the reticle MA is held by the support, that the pivot axis PX allows a pivoting of the movable part MP with respect to the support and that the linear motor LM is connected to the support, thus generating a force between the movable part MP and the support. The linear motor LM may be connected to the support and/or to any other structure that moves with the reticle, e.g. a long stroke or short stroke actuator thereby simplifying a provision of power lines etc.

According to an embodiment of the invention, the movable part is substantially balanced with respect to the pivot axis PAX in the direction of movement, thus in the direction indicated by the arrow ACC. The direction of movement is thus to be understood as the direction in which accelerations and decelerations take place prior to or during an exposure by the lithographic apparatus. It is to be understood that in between movements in the direction of acceleration (including the reverse direction) also movements of the support in other directions may take place, for example, between scanning movements.

Figure 3:
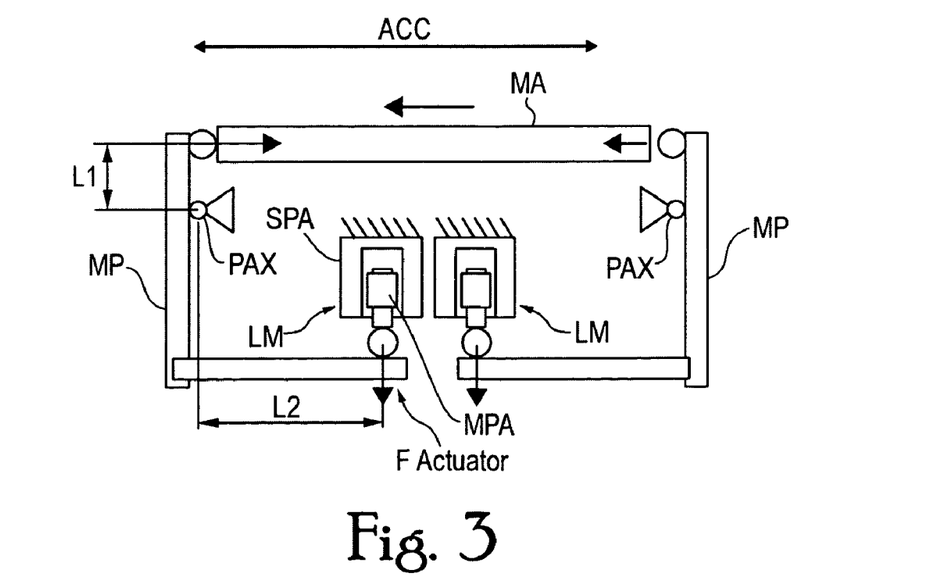
FIG. 3 schematically depicts an patterning device and a force actuator device according to an embodiment of the invention.

The principle described here may however be applied for any direction of acceleration, and force actuating devices may be positioned such as to exert forces onto the reticle MA in an appropriate direction. It is to be understood that in this document, when a term direction is used, this term may include an opposite of that direction as well. Thus, as an example, when referring to the direction indicated by the arrow ACC in FIG. 2, that direction may also include a direction opposite to one indicated by the arrow ACC. As mentioned above, according to an embodiment of the invention, the movable part may in the direction of movement of the support be substantially balanced with respect to the pivot axis. Thus, when an acceleration of the support takes place (such as the acceleration indicated by the arrow ACC in FIG. 2, the movable parts MP will not pivot by themselves about the pivot axis PAX, because a product of masses and arms balance each other with respect to the pivot axis in case of a movement of the support in the direction indicated by ACC. A mass of a movable part of the motor (which part is attached to the movable part) may also be included in the balancing, to take account of any effects thereof which would deteriorate the balancing of the balanced arm. It is beneficial to position the motor such that a direction of movement of the movable part of the motor is under substantially 90 degrees with respect to a direction of the acceleration of the stage, as shown in FIG. 3. Thereby, the movable part may be balanced more easily, or a force on the movable part of the motor due to the acceleration may be lead into a pivot.

FIG. 3 shows an alternative embodiment for the force actuator device as depicted and described with reference to FIG. 2. FIG. 3 shows reticle MA, movable parts MP which are pivotable about respective pivot axis PAX, and linear motors, in this example Lorenz Motors LM to exert a force onto the respective movable part MP. In the embodiment depicted in FIG. 3, the point of application where the actuator LM is to apply the force on the movable part, (more precisely, on the second arm of the movable part), is offset with respect to the pivot axis PAX in the direction of movement of the support, which is indicated by ACC. Thereby, a balancing of the movable part MP in the direction indicated by ACC may be facilitated. This is because the offsetting of the point of application in the direction indicated by the arrow ACC, allows on the one hand to construct a movable part having a relatively long lever of the linear motor LM or any other actuator in general, with respect to the lever from the pivot axis to the contact point where the movable part is to contact the mask MA. On the other hand, the offsetting facilitates a balancing in the direction of movement. In the example of the movable part shown in FIG. 2. The second arm of the movable part MP extends between the pivot axis PAX and the linear motor in a direction substantially perpendicular to the direction indicated by the arrow ACC. Also, the first arm of the movable part MP which extends between the axis PAX and the contact point where the movable part MP is to contact the reticle MA also extends in that same direction. To achieve a leverage effect, thereby allowing a relatively compact actuator to generate a high force onto the reticle MA, a large leveraging, thus a long lever of the second arm with respect to the length of the lever of the first arm, is to be achieved. This makes a balancing of the movable part in the direction of movement, difficult or otherwise may restrict an amount of leverage to be achieved.

In the embodiment shown in FIG. 3, a lever of the linear motor LM with respect to the pivot axis PAX is substantially provided by L2. The length of the lever of the contact point with respect to the pivot axis PAX is substantially provided by L1. Thus, with the configuration depicted here, a relatively long length of L2 may be achieved with respect to a length of L1 without too much extending the second arm of the movable part in the direction substantially perpendicular to the direction of acceleration, thus in a direction substantially the same as that indicated by L1. Thereby, a balancing of the movable part may be achieved, while at the same time obtaining a high leverage, thus enabling a use of a relatively compact linear motor or other actuator for generating a large force onto the reticle MA by means of a leverage effect.

A further embodiment of the invention is explained with reference to FIG. 3. As depicted in FIG. 3, the actuator is able to exert an actuator force, indicated by $F_{actuator}$ to the second arm of the movable part P in a direction substantially perpendicular to the direction of movement, the direction of movement being indicated by ACC. Thereby, it may be achieved that the linear motor (or other actuator) is not required anymore to hold its own weight when accelerating in the direction indicated by ACC, takes place. (when the actuator has its own guiding). In the set up shown in FIG. 2, the linear motor, and in particular a movable part thereof has a direction of movement which is substantially parallel to the direction indicated by ACC. Thereby, when accelerating in the direction ACC, the motor is to generate a force, to be able to accelerate movable parts synchronous with the acceleration of the support. Thus, in that case the motor is required to generate a force in proportion to the acceleration, which does not result in any force by the movable part MP onto the reticle MA, thereby keeping the movable part of the linear motor at its place with respect to a stationary part which accelerates with the support, as the stationary part is connected to the support. Any force to be generated by the axis is in this example to be generated on top of the force, required to hold the weight of the movable part of the motor. Thus, in the example shown in FIG. 2, an additional force is to be generated by the linear motor or other actuator for the sole reason to hold its own weight. This may be prevented in the configuration shown in FIG. 3. Here, a movement of the movable part of the actuator LM is in a direction perpendicular to the direction of acceleration, and similarly a force by the actuator is perpendicular to the direction of acceleration indicated by ACC. In FIG. 3, the movable part of the actuator is indicated by MPA. The movable part MPA of the actuator may be guided with respect to the stationary part SPA of the actuator by any suitable guiding device, such as a bearing/guide, a sliding mechanism, a leaf spring etc. In the configurations shown in FIG. 3, the actuator thus only generates the force F actuator during acceleration, thereby preventing a need for the actuator to generate a force to hold its own weight (correctly speaking to hold the weight of the movable part MPA thereof during the acceleration of the support, thus the acceleration of the stationary part SPA of the respective actuator). The movable part of the actuator MPA may be hingeably (or otherwise movably) connected to the second arm of the movable part MP, thereby avoiding that the mass thereof is felt by the movable part.

In the example shown in FIG. 3, the force by the actuator on the second arm is substantially perpendicular to the direction of movement off the support (i.e. the direction indicated by ACC.). Other (i.e. non perpendicular) angles may be used also, so that the balancing of the movable part may be tuned.

Figure 4:
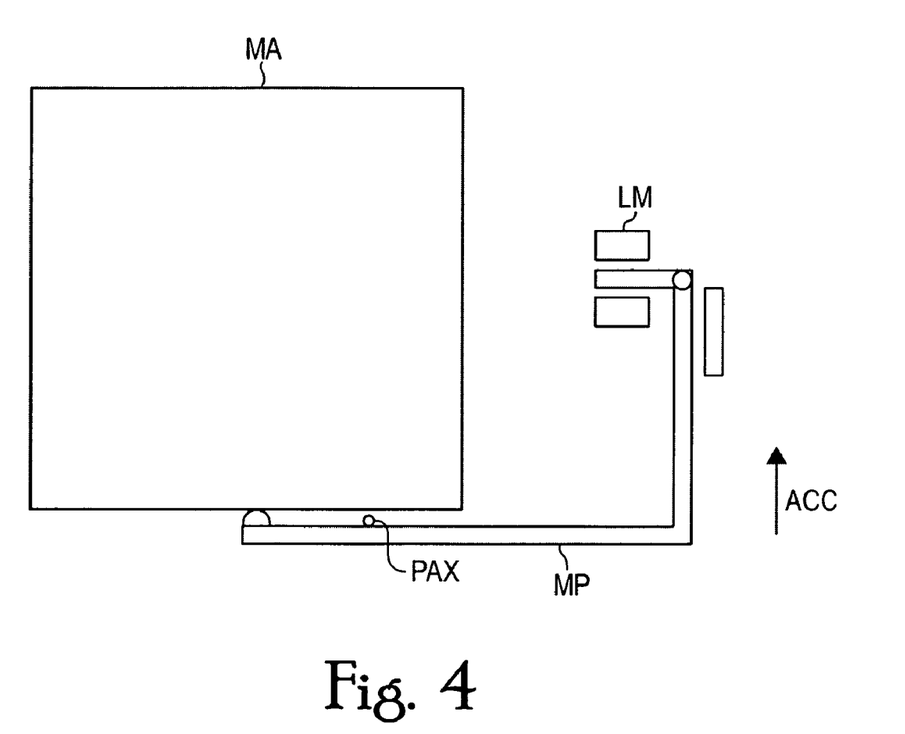
FIG. 4 depicts a mask and a force actuator device according to an embodiment of the invention.

FIG. 4 shows an alternative embodiment of the force actuation device shown and described with reference to FIG. 3. In the configuration shown here, the pivoting of the movable part MP is about a pivot axis PAX which is substantially perpendicular to a surface of the reticle MA, while in the embodiment shown in FIG. 3, and also in the embodiment shown in FIG. 2, the pivot axis PAX is substantially parallel to the surface of the reticle MA. With the configuration shown in FIG. 4, a compact force actuator device may be achieved. It is noted that FIG. 4 shows a top view of the reticle MA, thus contrary to FIGS. 2 and 3, where the reticle is seen from a side.

A still further embodiment will now be described with reference to FIG. 5A. The embodiment shown in FIG. 5A mainly differs from the embodiments shown and described with reference to FIGS. 2-4, in that the actuator (in the examples shown above the linear motor) does not act immediately or directly onto the movable part, however instead thereof the actuator is to act onto the movable part via a second movable part. The second movable part MP2 is pivotable with respect to the support about a second pivot axis PAX2. Thereby, and additional leverage effect of the force generated by the actuator (such as the linear motor LM) may be achieved: a lever from the linear motor to the second pivot axis PAX2 is longer than a lever from the second pivot axis PAX2 to a contact point where the second movable part MP2 is connected to the movable part MP. Thus, a force which is exerted by the second movable part MP2 on to the movable part MP is larger than the force generated by the linear motor LM, again enabling to reduce a size of the linear motor LM and consequently a weight thereof. The second movable part MP2 may be balanced with respect to the second pivot axis PAX2 in the direction of movement of the support (thus in the direction indicated by the arrow ACC). The balancing thus substantially prevents the actuator (in this example the linear motor LM) to generate a force to prevent a rotation of the second movable part MP2 due to an acceleration of the support in the direction indicated by the arrow ACC. The second movable part MP2 may rest against the movable part MP, however, it is preferred that a hingeable connection between the second movable part MP2 and the movable part MP be applied, thereby enabling the linear motor to rotate the movable part to some extent away from the reticle MA, thus thereby providing a gap between the movable part MP and the reticle MA. To avoid any disturbance of the pattern of the reticle MA by the movable part resting against it. The leverage effect of the second movable part as mentioned above is in the example shown here achieved in that a third arm of the second movable part which extends from the second pivot axis PAX2 to the point of application of the actuator, includes a length which exceeds a length of a fourth arm of the second movable part, the fourth arm extending from the second pivot axis PAX2 to the actuator.

Figure 5A:
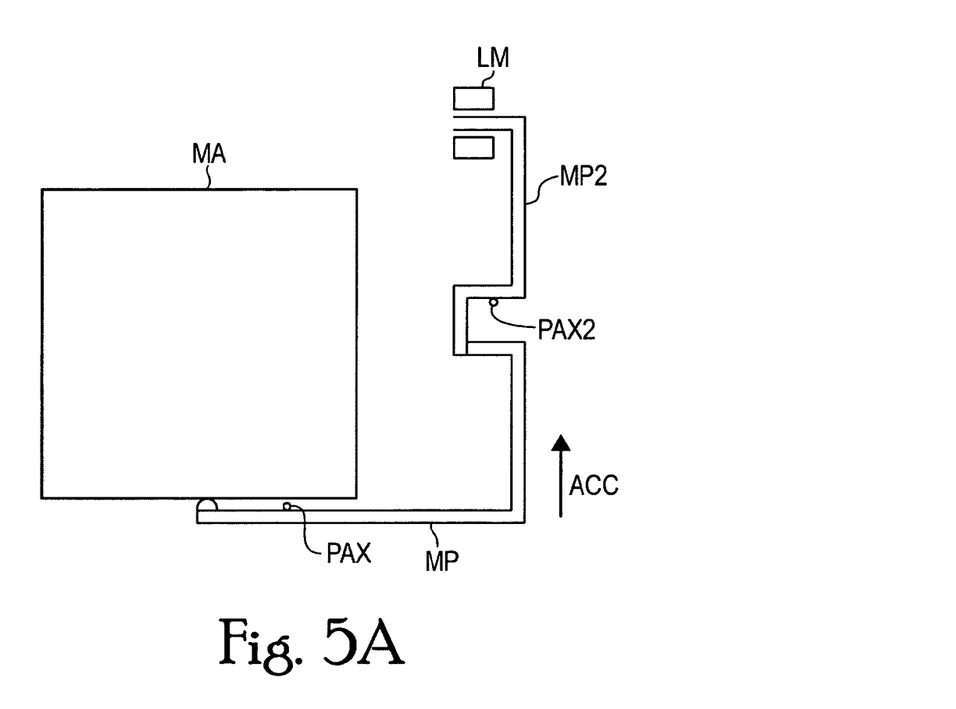
FIGS. 5A and 5B each depict a mask and a force actuator device according to an embodiment of the invention.
Figure 5B:
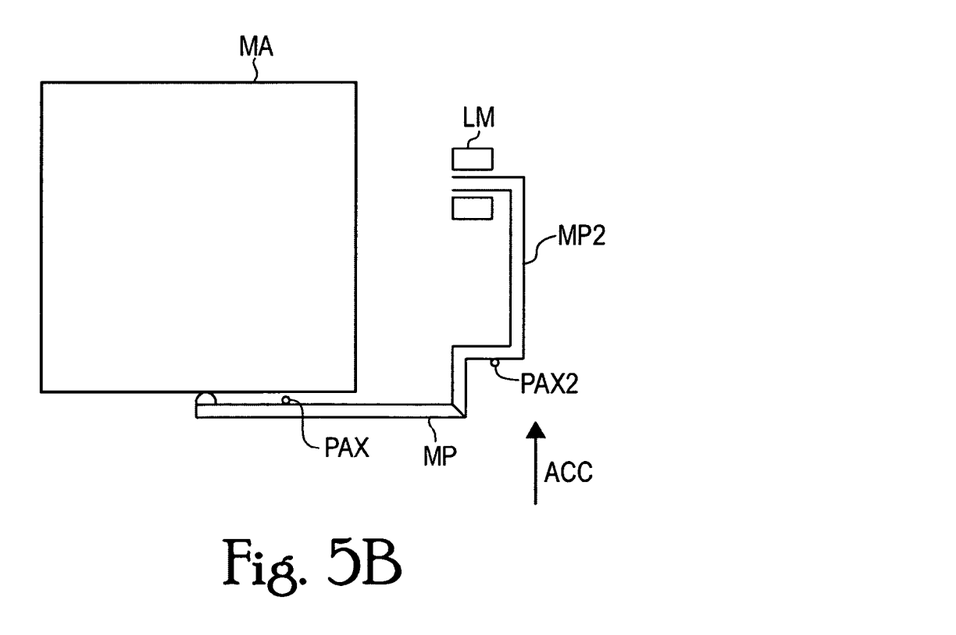

A variant to the embodiment according to FIG. 5A is shown in FIG. 5B. The embodiment as depicted here differs from that according to FIG. 5A in that a part of the first movable part of FIG. 5A which is parallel to the direction of acceleration ACC has been removed in FIG. 5B. Thus, the first movable part in this more simplified embodiment essentially includes a straight part only, while the second movable part MP2 is connected (e.g. pivotably or via a sliding mechanism) to an end of the first movable part. A further functioning of the FIG. 5B embodiment is substantially similar to that of FIG. 5A. Similar effects thus also occur here.

In the examples shown here, a linear motor has been shown as an actuator (the linear motor may e.g. comprise a Lorenz motor or any other linear motor). Alternatively, or instead thereto, the actuator may include a piëzo electric actuator, an hydraulic actuator and/or a pneumatic actuator. Reasons for choosing a specific type of actuator in a specific application may be found in an area of response time, weight, maximum force, a volume, and/or dynamic properties. Instead of or in addition to the Lorenz motor, the linear motor which is used in the examples described here may also include a Maxwell motor.

Figure 6A:
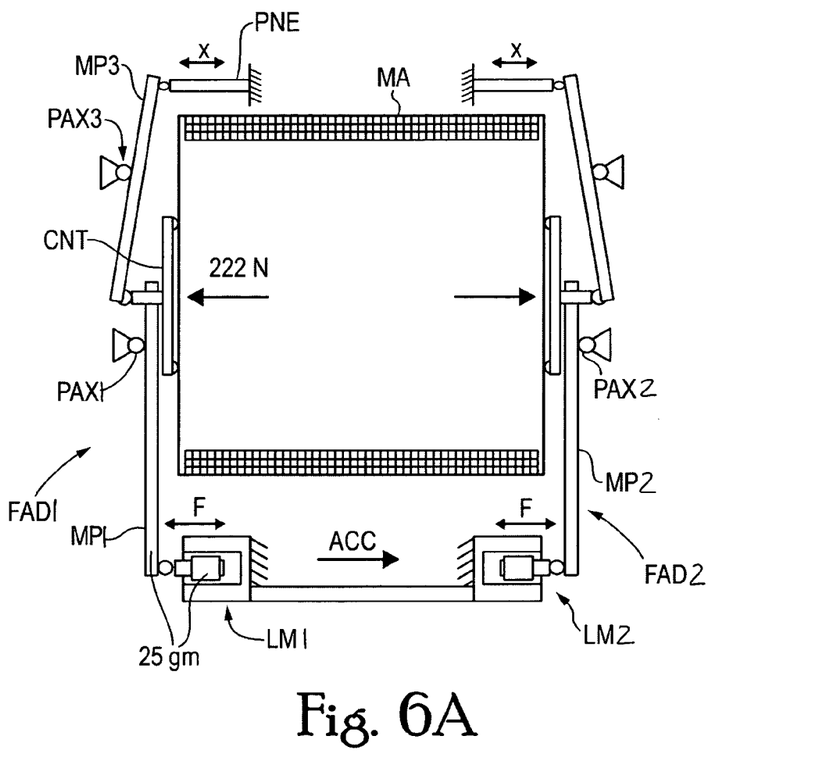
FIGS. 6A and B depict a mask and a force actuator device according to an embodiment of the invention.

A further embodiment of the invention will now be described with reference to FIGS. 6a and 6b. FIG. 6a shows a top view of a reticle and a pair of force actuation devices FAD1, FAD2 (which may also be referred to as force actuator devices). Force actuation device FAD1 includes movable part MP1 which is pivotable about pivot axis PAX1, and linear motor LM1 to exert via the movable part MP1 a force on to a side of the reticle MA in a direction of acceleration indicated by ACC. Similarly, force actuator device FAD2 includes movable part MP2 pivotable about pivot axis PAX2, and a linear motor LM2 to exert via the movable part MP2 a force on to the reticle MA in a direction opposite to the direction indicated by arrow ACC. The force actuation devices FAD1, FAD2 in this example also include an open-close mechanics. The open-close mechanics enable the force actuation devices FAD1, FAD2 to cope with positioning inaccuracies or size inaccuracies of the reticle MA. To be able to exert a relatively large force on the reticle MA with a relatively small linear motor, leverage by the movable part MP1, MP2 is applied. Due to the leverage however, a range of movement of the movable part MP1, MP2 at a contact point with the reticle MA is reduced with respect to the stroke of the linear motors LM1, LM2. The open-close mechanics as depicted and as will be described with reference to FIG. 6a, enables to increase the above-mentioned range of movement. Thereto, in the example shown here an actuator is provided, such as in this example a pneumatic element PNE, such as a pneumatic cylinder. A dimension of the pneumatic element in X-direction may be avoid, e.g. by pressurizing/depressurizing the element, the pneumatic element being connected to a third movable part MP3 which is pivotable about a third pivot axis PAX3. By changing a length of the pneumatic element, the movable part MP3 will pivot about its pivot axis PAX3. The movable part MP3 is in this embodiment connected to a contacting part CNT, to contact the side of the reticle MA. During a position or placing of the reticle MA on or in the support, the pneumatic element PNE is actuated to move the contacting part CNT away from the reticle MA, thereby providing sufficient space to position the reticle MA, including position tolerances, size tolerances of the reticle, etc. Then, the pneumatic element PNE is actuated to move the contacting part CNT towards the side of the reticle MA to have the contacting part rest or almost rest against a side of the reticle MA. A holding mechanism may be provided to establish a connection between the first movable part MP1 and the contacting part CNT thereby creating a connection between them. Such connection may e.g. be established by a self breaking mechanism such as an active break, pneumatic, hydraulic, piezo, etc. Now, an appropriate range of movement of the contacting part CNT is provided, as the linear motor LM1, LM2 may now provide a suitable range of movement of the contacting part CNT and enable to exert a force onto the side of the reticle. It is noted that any of the other embodiments as described with reference to FIG. 2-5 may also be provided with a contacting part CNT, with or without the displacement mechanism as described with reference to FIG. 6a.

Figure 6B:
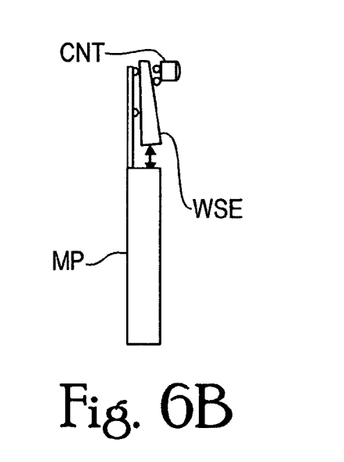

An alternative displacement mechanism is shown in FIG. 6b. A detailed view of a part of the movable part MP is shown. More particularly, FIG. 6b shows an end of the movable part MP which is to contact the reticle MA. In detail, FIG. 6b shows a contacting part CNT for exerting the force against the side of the reticle MA. A wedge shaped element WSE between the contacting part CNT and the movable part MP, such as a pneumatic element may be provided to move the wedge shaped element in the direction indicated by the arrow, thereby displacing the contacting part CNT in a direction perpendicular thereto as a width of the wedge shaped element WSE at a location were it contacts the contacting part CNT changes when the wedge shaped element is moved in the direction of the arrow. A range of movement of the contacting part CNT of the movable part MP may be changed by displacing the wedged shaped element WSE in the direction of the arrow.

Figure 7:
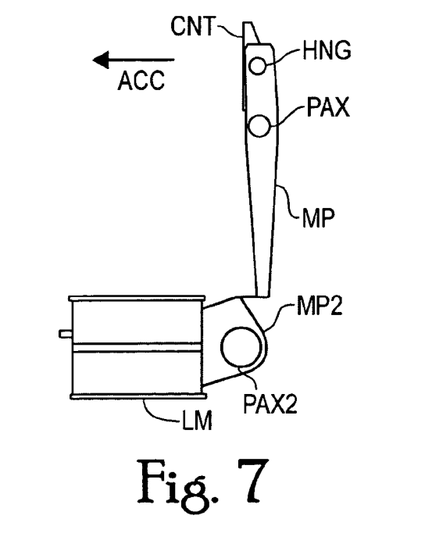
FIG. 7 depicts a force actuator device according to an embodiment of the invention.

A practical example of an embodiment of the invention is depicted in FIG. 7. FIG. 7 shows a top view of an embodiment of the force actuator device, again showing movable part MP, pivotable about pivot axis PAX and having contacting point CNT, and linear motor LM, pivotable about pivot axis PAX2. In the direction of acceleration, movable part MP is balanced with respect to the pivot axis PAX, thereby providing benefits as described above. Movable part MP 2 including a movable part of the linear motor LM are balanced with respect to pivot axis PAX2. Thereby, acceleration forces of the movable part MP2 including the movable part of the linear motor LM may be supported by the pivot, thereby substantially preventing a rotation of the movable part MP2 with respect to the pivot axis PA2. As the movable part MP2 interacts with movable part MP, a rotation of MP, and may consequently result in a change of the force by the contacting point CNT on the reticle. A part of the first movable part (for example the contacting part CNT) may be movable with respect to a remainder of the movable part MP (in this example via hinge HNG or a suitable guiding mechanism), thereby enabling the contacting part to be moved away from the reticle, for example to enable a more easy exchanging of the reticle or to enable the mechanism shown here to cope with differently sized reticles.

Figure 8A:
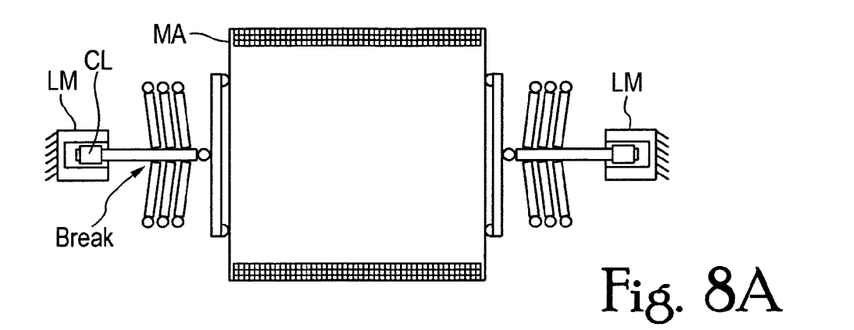
FIG. 8A-H schematically depict break concepts and alternative mechanisms to apply a force to the patterning device, in accordance with an embodiment of the invention.
Figure 8B:
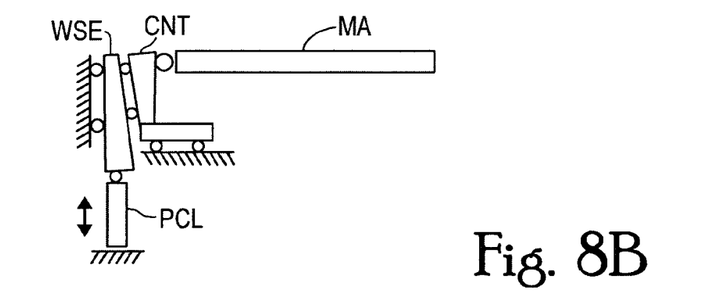
Figure 8C:
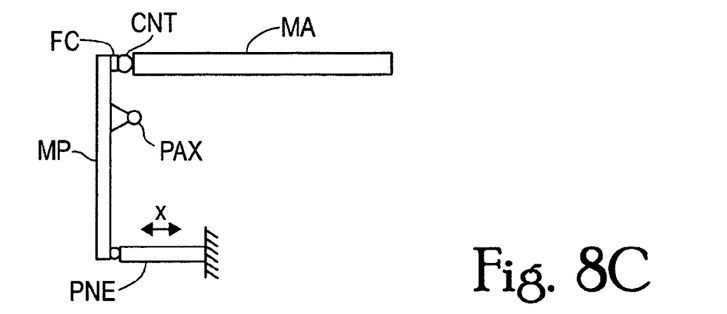
Figure 8D:
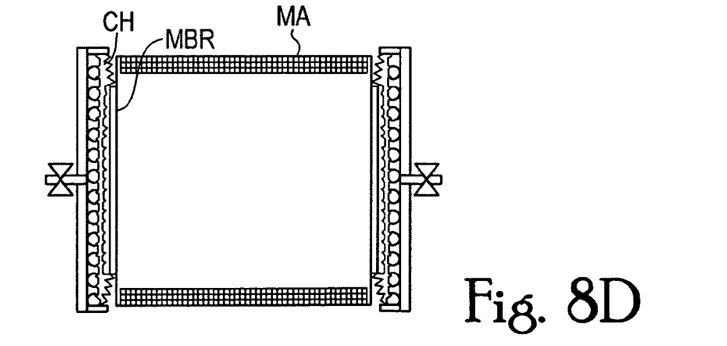

A plurality of alternative solution is shown with reference to FIGS. 8a-h and 9a-h. FIG. 8a-d show possible implementations for the additional actuator of the embodiments shown in FIGS. 6A and B. In the example according to FIG. 6A, this additional actuator includes pneumatic element PNE. FIG. 8a shows a mechanism where a Lorenz motor directly exerts a force on to a contacting part CNT, and making use of a breaking mechanism LM to hold the Lorenz motor and contacting part at its position. FIG. 8b shows a pneumatic cylinder PLC which is able to displace a wedge shaped element WSE in the direction indicated by the arrow. By displacement of the wedge shaped element, a width thereof at a part where it contacts contacting part CNT changes, thereby displacing the contacting part CNT. FIG. 8c show a spindle, comprising movable part MP and an actuator such as a pneumatic element PNE or a linear motor, etc. A force cell FC may be provided between the movable part MP and a contacting point CNT to contact the side of the mask MA. By actuating the pneumatic element PNE, the movable part may be held to rest against the mask MA via the contacting part CNT. The force cell may now be applied to exert a force on to the side of the mask MA via the contacting part CNT. FIG. 8d shows a pneumatic solution where a fluid, such as a gas or a liquid may be provided to exert a force onto a side of the mask MA. Thereto, a chamber CH may be provided with a membrane MBR or other movable means, the fluid in the chamber CH via the membrane exerting a force on to the side of the reticle MA.

Figure 8E:
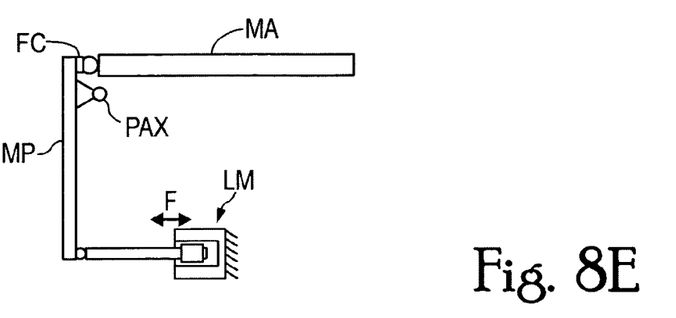

The solution described with reference to FIG. 8a-d may provide for a force on to the side of the reticle, primarily however for the solutions presented here are intended provide an open/closing mechanism thus providing for a range of movement of the contacting part CNT (in FIG. 8d represented by the membrane MBR). These solutions may also be used to exert a force onto a side of the reticle. FIG. 8e-h show a plurality of pusher concepts to exert a force on to the side of the reticle MA. FIG. 8e depicts a configuration which is partly similar to the described with reference to FIG. 2. In addition, the pivot axis PAX has been positioned in line with a surface of a side of the reticle MA against which the force application mechanism may push, thereby preventing traction at the service of the side of the reticle MA. Between the contacting points CNT and the movable part MP a force cell may be provided. The force cell includes a sensor to provide information of a magnitude of the force to which it is subjected. This may be useful in that it allows to control a magnitude of the force by a suitable control system, such as a feedback control system which drives the actuator in question.

Figure 8F:
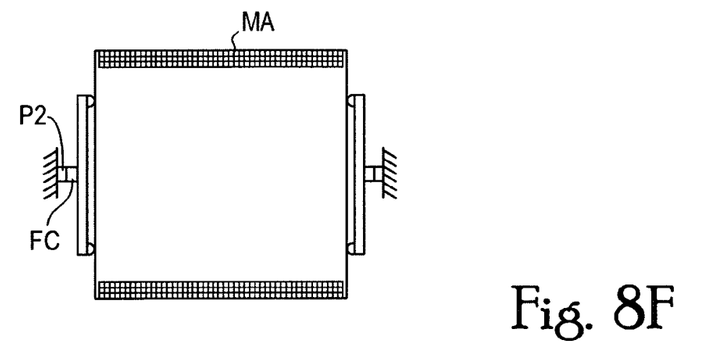
Figure 8G:
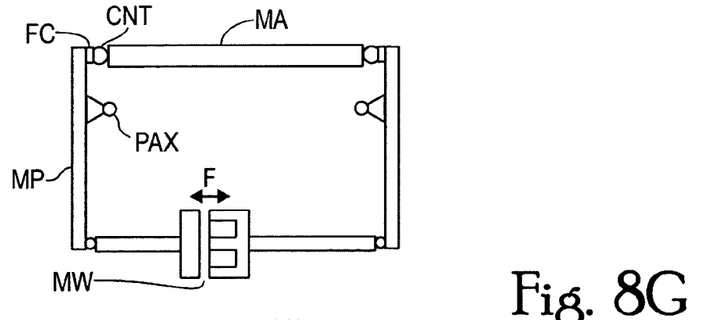
Figure 8H:
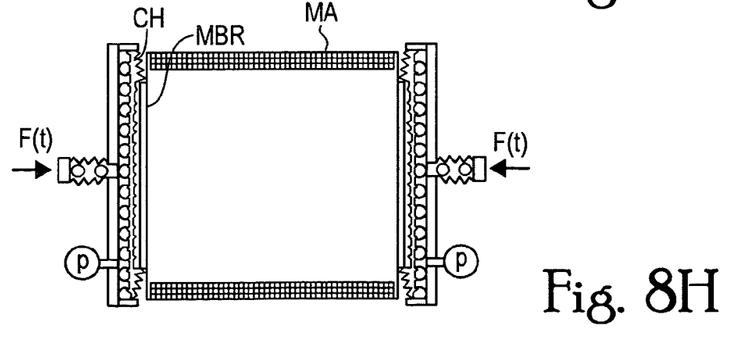

FIG. 8f-h show alternative embodiments for the Lorenz motor actuator mentioned above. FIG. 8f shows a piëzo actuator PZ, possibly combined with a force cell FC to push against the side of the reticle MA via contacting part CNT. FIG. 8g shows a Maxwell motor combining dual force application devices, the Maxwell motor MVM via movable parts MP which are pivotable about pivot axis PAX exerting a force via force cells FC and contacting parts CNT on to the reticle MA. FIG. 8h again shows a pneumatic solution where a fluid such as a liquid or a gas is guided into a chamber CH to via membrane MBR exert a force on to the side of the substrate. A servo loop may be provided by including a pressure sensor P, an output signal of the pressure sensor P being applied to adjust the pressure to be exerted by the fluid on to the membrane MBR. In FIG. 8h, the fluid is pressurized by exerting a force on movable cylinder MC thereby exerting a force on to fluid. In this particular example, it is preferred to make use of a liquid, as a small volume change by a force on to the cylindrical element will result in relatively large pressure changes in the chamber, and therefore in a relatively large change of the force by the membrane MBR on the side of the mask MA.

Being provided with the many examples as has been discussed previously, the skilled person will appreciate a plurality of combinations and modifications may be derive therefrom. For example, the skilled person incorporate the contacting part CNT as shown in for example FIG. 6a into any of the solutions according to FIGS. 2-5. Similarly, the skilled person may apply any of the open /closing solutions as presented in FIG. 8a-d in the mechanism as described with reference to FIGS. 2-7.

Further, in some of the examples provided here, a mechanism has been depicted and described for exerting a force on to one side of the reticle only, while in other examples dual mechanisms have been shown and described to exert forces on opposite sites of the reticle MA. The skilled person will appreciate that any of the solutions presented here may be applied as a single sited mechanism, thus to apply a force on to a single side of the reticle only, or may be implemented on dual sides of the reticle, thereby enabling to exert forces on both sides. Further, each of the solutions presented here may also be used in threefold or fourfold, each of the mechanism to apply a force on to a different side of the substrate. Thereby, in embodiments, accelerations of the support in any of the four directions may be compensated for or at least partly compensated for by exerting a force on to an appropriate side of the reticle MA by an appropriate part of the force application mechanisms as described here.

Instead of or in addition to the movable part which is pivotable about a pivot axis, other transfer mechanisms to transfer a force onto the side of the reticle, may be applied also, such as for example a hydraulic transfer mechanism.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a radiation system configured to condition a beam of radiation;
   a support constructed to support a patterning device, the patterning device being capable of imparting the radiation beam with a pattern in its cross-section to form a patterned radiation beam, the support comprising a force actuator device to exert a force onto the patterning device in a direction of movement of the support, the force actuator device comprising:
   (i) a movable part that is pivotable about a pivot axis connected to the support, the movable part being substantially balanced with respect to the pivot axis in the direction of movement of the support, and
   (ii) an actuator to exert the force onto the patterning device via the movable part;
   a controller to drive the actuator based on an acceleration of the support in the direction of movement;
   a projection system configured to project the patterned beam of radiation onto a substrate; and
   a substrate table configured to support the substrate,
   wherein the actuator is configured to remain in a substantially rest state when the support accelerates, from a position where the support is at rest, in a direction that is opposite to said direction of movement.

2. The lithographic apparatus according to claim 1, wherein the controller is arranged to drive the actuator substantially proportionally to the acceleration of the support in the direction of movement.

3. The lithographic apparatus according to claim 1, wherein the actuator comprises at least one of a piëzo electric actuator, a linear motor, an hydraulic actuator, and a pneumatic actuator.

4. The lithographic apparatus according to claim 3, wherein the linear motor comprises a Lorenz motor.

5. The lithographic apparatus according to claim 3, wherein the linear motor comprises a Maxwell motor.

6. The lithographic apparatus according to claim 1, wherein the force actuator device further comprises a displacement mechanism to displace a range of action of the movable part.

7. The lithographic apparatus according to claim 6, wherein the displacement mechanism comprises at least one of a pneumatic cylinder, an excentric part, a piezo actuator, an hydraulic cylinder/membrane.

8. The lithographic apparatus of claim 1, wherein the movable part is substantially balanced with respect to the pivot axis in the direction of movement of the support such that during acceleration of the support, and in absence of the force exerted by the actuator, the movable part substantially does not pivot about the pivot axis.

9. A lithographic apparatus comprising:
   a radiation system configured to condition a beam of radiation;
   a support constructed to support a patterning device, the patterning device being capable of imparting the radiation beam with a pattern in its cross-section to form a patterned radiation beam, the support comprising a force actuator device to exert a force onto the patterning device in a direction of movement of the support, the force actuator device comprising:
   (i) a movable part that is pivotable about a pivot axis connected to the support, the movable part being substantially balanced with respect to the pivot axis in the direction of movement of the support, and
   (ii) an actuator to exert the force onto the patterning device via the movable part;
   a projection system configured to project the patterned beam of radiation onto a substrate; and
   a substrate table configured to support the substrate,
   wherein the movable part comprises a first arm extending between the pivot axis and a contact part with which the movable part is to contact the patterning device, and a second arm extending between the pivot axis and a point of application where the actuator applies an actuator force on the second arm, the first arm being balanced with respect to the second arm in the direction of movement of the support.

10. The lithographic apparatus according to claim 9, wherein a length of the second arm from the point of application to the pivot axis exceeds a length of the first arm from the contact point to the pivot axis.

11. The lithographic apparatus according to claim 9, wherein the point of application of the second arm is offset with respect to the pivot axis in the direction of movement of the support.

12. The lithographic apparatus according to claim 11, wherein the actuator is configured to exert an actuator force onto the second arm in a direction perpendicular to the direction of movement.

13. The lithographic apparatus according to claim 12, wherein the actuator is configured to act directly onto the first movable part.

14. The lithographic apparatus according to claim 12, wherein the actuator is configured to act onto the first movable part via a second movable part, the second movable part being pivotable with respect to the support about a second pivot axis.

15. The lithographic apparatus according to claim 14, wherein the second movable part is balanced with respect to the second pivot axis in the direction of movement of the support.

16. The lithographic apparatus according to claim 14, wherein the second movable part is hingeably connected to the first movable part.

17. The lithographic apparatus according to claim 14, wherein the second movable part comprises a third arm extending from the second pivot axis to the point of application and a fourth arm extending from the pivot axis to the actuator, the fourth arm extending in the direction of movement, wherein a length of the fourth arm exceeds a length of the third arm.

18. A stage apparatus for displacing an object having a substantially flat surface, comprising:
   a support constructed to support the object, the support comprising a force actuator device to exert a force onto the object in a direction of movement of the support, the force actuator device comprising:
   (i) a movable part that is pivotable about a pivot axis connected to the support, the movable part being substantially balanced with respect to the pivot axis in the direction of movement of the support, and
   (ii) an actuator to exert the force onto the object via the movable part, the actuator configured to be driven by a controller based on an acceleration of the support in the direction of movement,
   wherein the actuator is configured to remain in a substantially rest state when the support accelerates, from a position where the support is at rest, in a direction that is opposite to said direction of movement.

19. A support assembly for a lithographic apparatus, comprising:

a support configured to support a patterning device;

a moveable part that is pivotable about a pivot axis, the moveable part being substantially balanced with respect to the pivot axis in a direction of movement of the support; and an actuator configured to exert a force onto the patterning device via the moveable part, the actuator configured to be driven by a controller based on an acceleration of the support in the direction of movement, wherein the actuator is configured to remain in a substantially rest state when the support accelerates, from a position where the support is at rest, in a direction that is opposite to said direction of movement.

20. A lithographic apparatus comprising:

a radiation system configured to condition a beam of radiation;

a support constructed to support a patterning device, the patterning device being capable of imparting the radiation beam with a pattern in its cross-section to form a patterned radiation beam, the support comprising a force actuator device to exert a force onto the patterning device in a direction of movement of the support, the force actuator device comprising:

(i) a movable part that is pivotable about a pivot axis connected to the support, and (ii) an actuator to exert the force onto the patterning device via the movable part, the movable part being substantially balanced with respect to the pivot axis in the direction of movement of the support such that, in absence of the force exerted by the actuator, the movable part substantially does not pivot about the pivot axis when the support accelerates from a position where the support is at rest;

a projection system configured to project the patterned beam of radiation onto a substrate; and a substrate table configured to support the substrate.

\* \* \* \* \*